United States Patent
Dagan et al.

(10) Patent No.: US 6,934,901 B2
(45) Date of Patent: Aug. 23, 2005

(54) BLOCK INTERLEAVER METHOD AND SYSTEM

(75) Inventors: Amit Dagan, Shimshit (IL); Ofir Avni, Moshav Ram-on (IL)

(73) Assignee: Intel Corporation, Santa Clara, CA (US)

(*) Notice: Subject to any disclaimer, the term of this patent is extended or adjusted under 35 U.S.C. 154(b) by 497 days.

(21) Appl. No.: 10/000,341

(22) Filed: Dec. 4, 2001

(65) Prior Publication Data

US 2003/0105996 A1 Jun. 5, 2003

(51) Int. Cl.$^7$ .............................................. G06F 11/00
(52) U.S. Cl. ........................................................ 714/747
(58) Field of Search ................................. 714/747, 746, 714/752, 753, 755, 758, 786, 790, 701, 702; 341/81; 375/701

(56) References Cited

U.S. PATENT DOCUMENTS 6,594,792 B1 * 7/2003 Hladik et al. ................. 714/55

* cited by examiner

Primary Examiner—Albert Decady
Assistant Examiner—James C Kerveros
(74) Attorney, Agent, or Firm—Kenyon & Kenyon

(57) ABSTRACT

A method and system for interleaving blocks of data. The method includes partitioning an input bitstream into multiple bitstreams, interleaving the multiple bitstreams into a single bitstream, partitioning the single bitstream into multiple different bitstreams, and shuffling the bits of the different bitstreams. Exemplary applications include the IEEE 802.11a standard interleaver stage.

26 Claims, 13 Drawing Sheets

18 registers each consist of 16 bits 16 registers each consist of 18 bits

Starting from Reg 0-8 then bit-interleaving with Reg 4-12 inserts bit 0 of Reg 4 between those of Reg 0 and 8, pushing bit 0 of Reg 8 to the right, and so on .... until the bits are ordered consecutively, from 0 to 15

12 registers each consist of 16 bits → 16 registers each consist of 12 bits 12 registers each consist of 16 bits → 16 registers each consist of 12 "interleaved" bits 3 registers each consist of 16 bits 16 registers each consist of 3 "interleaved" bits

BLOCK INTERLEAVER METHOD AND SYSTEM

FIELD OF THE INVENTION

The present invention relates generally to data manipulation and, more particularly, to methods, systems, and machine readable media for interleaving data efficiently.

BACKGROUND INFORMATION

Data transmission technology continues to experience significant growth, particularly in the area of communications. People exchange information every day using such devices as telephones, faxes, pagers, etc. In order to make this communication seamless, protocols have been established to designate how data should be transmitted between devices in a communication network.

Open Systems Interconnection (OSI) is a description of how messages should be transmitted between any two points in a communication network. OSI divides the network into seven layers. The first layer, called the physical layer, conveys bitstreams of data through the network at the electrical and mechanical level. The physical layer provides the protocol for sending and receiving data on a transmission carrier or subcarrier. An exemplary implementation of this protocol is defined by the IEEE 802.11a standard, IEEE std. 802.11a-1999, approved Sep. 13, 1999 which specifies the physical layer of a wireless LAN system.

As data is transmitted along a network, portions of the data may become corrupted by noise from the network itself or interference from other transmission sources. Part of the physical layer protocol includes treating the transmitted data to minimize error effects on the entire bitstream and ultimately the data quality at the receiving end. One treatment protocol includes interleaving the transmitted data. Interleaving involves rearranging the data as it is transmitted such that if the received stream is corrupted, the corrupted area will be dispersed once the inverse operation (de-interleaving) is applied. Thus, the receiver receives a bitstream of good data with an intermittent corrupt bit in a way that enables the receiver to correct the corruption and restore the original transmitted bitstream.

Conventional interleavers include a table driven approach and an unroll approach. In the table driven approach, a memory table stores a location of every bit output from the network. For every input bit, the method reads the location of the corresponding output bit from the table and places the input bit accordingly in the output bitstream. In the unroll approach, a completely rolled piece of code uses a few instructions to extract each input bit and directly shuffle it to the appropriate location in the output bitstream. However, these approaches use a large number of instructions and/or a large number of memory accesses to perform the interleaving. As a result, conventional interleavers are slow and inefficient.

Accordingly, there is a need in the art for an efficient interleaving method and system.

DETAILED DESCRIPTION

Embodiments of the present invention provide a method for interleaving blocks of data. The block interleaver may be used in data transmission systems to minimize the effects of consecutive corrupted data. Performing the block interleaving efficiently saves several execution cycles that allow a decrease in the overall execution latency of the physical layer.

Figure 1:
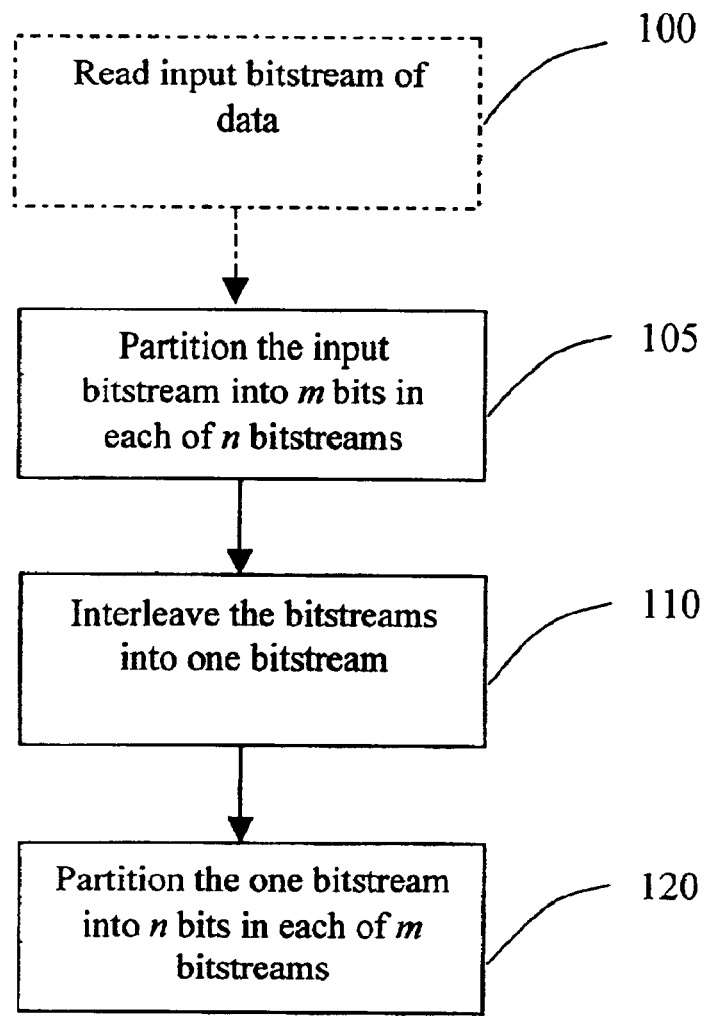
FIG. 1 is a flowchart of an embodiment of a method for interleaving blocks of data according to the present invention using bit interleaving and partitioning.

FIG. 1 shows one embodiment of a method of the present invention for interleaving blocks of data. First, an input bitstream may be partitioned into multiple bitstreams of a given size, such as n bitstreams, each including m data bits, the multiple bitstreams forming a data block structure (box 105). The input bitstream may be partitioned in a way that corresponds to, or best suits, the bitstream structures used in subsequent bit interleaving. As such, the partitioning enables efficient implementation of the bit interleaving. Accordingly, the number of instructions to place the input bitstream into a data block structure useful to the bit interleaver may be significantly reduced, providing for the decreased execution latency in the physical layer.

After the input bitstream is partitioned into multiple bitstreams having m bits each, the bits may be interleaved such that corresponding bits in each bitstream are alternately placed into a single bitstream (box 110). For example, given input bitstream $a=a_1a_2a_3a_4$ and input bitstream $b=b_1b_2b_3b_4$, the resulting interleaved bitstream may be $c=a_1b_1a_2b_2a_3b_3a_4b_4$.

After the bits are interleaved, they may then be partitioned into multiple bitstreams of another given size. Exemplary m bitstreams, each including n data bits, may be created by placing n consecutive bits into each of the m bitstreams (box 120). For example, given the interleaved bitstream $C=a_1b_1a_2b_2a_3b_3a_4b_4$, the resulting bitstream may be $d=a_1b_1$, $e=a_2b_2$, $f=a_3b_3$, $g=a_4b_4$. The net effect may be transposition of the input blocks of data into the output blocks. Such a transposition minimizes the effect corrupt bitstreams may have on data presentation by separating consecutive bits.

An exemplary way to receive data in FIG. 1 may be by reading in the input bitstream from one or more sources (box 100). However, other processes may interact with the present invention to supply the data as well.

Figure 2:
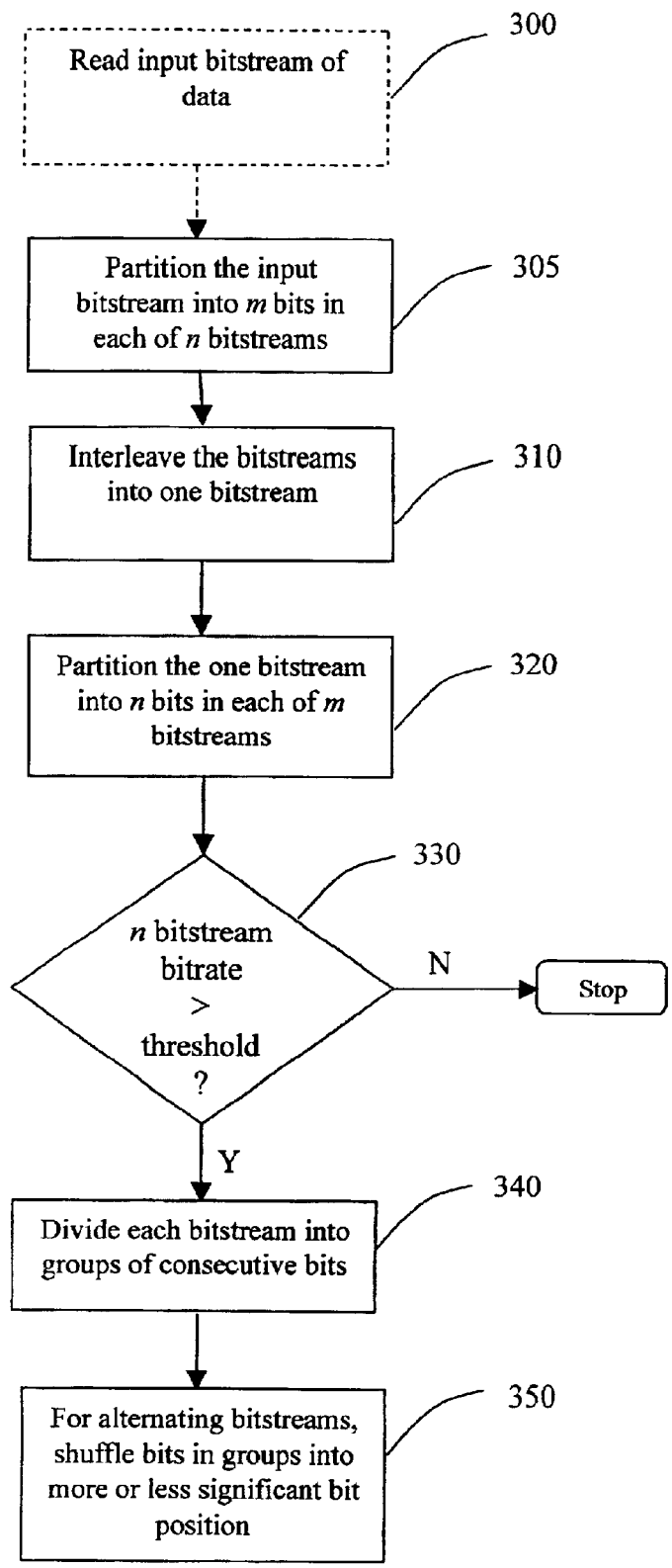
FIG. 2 is a flowchart of another embodiment of a method for interleaving blocks of data according to the present invention using bit interleaving, partitioning, and shuffling.

FIG. 2 is a flowchart of another embodiment of a method of the present invention for interleaving blocks of data. Similar to the operations described in FIG. 1, boxes 105, 110, and 120, the operations in boxes 305, 310, and 320 may be performed.

Next, the partitioned m bitstreams may be shuffled. The m bitstreams were partitioned in a way corresponding, or best suited, to the bitstream structures used in the bit shuffling. As such, the bit shuffling may be simplified so that a single operation may be performed on each of the m bitstreams. Optionally, the single operation may be different for each bitstream. Additional manipulations need not be used. Accordingly, the bit shuffling may be efficiently implemented.

The decision to shuffle may depend on the bitrate of the input data. At higher bitrates, i.e. higher numbers of bits transmitted, the number of ways to order bits is much greater than lower bitrates. As such, shuffling may be used to further increase the separation between consecutive bits in the data, thereby, further minimizing the effect of corrupt input data. Thus, if the input data bitrate exceeds a predetermined threshold, then the data may be shuffled as follows (box 330). First, each bitstream may be divided into groups of consecutive bits (box 340). The number of consecutive bits in each group may be any size up to n, the size of the bitstream. In alternate bitstreams, the groups of consecutive bits may then be shuffled into more and less significant bits (box 350). The bit shuffling occurs within the i-th bitstream (i.e. no bits may be permutated from one bitstream to another). For example, a most significant bit of a group in an (i+1)-th bitstream may correspond to a least significant bit of a corresponding group in an i-th bitstream. Input bitstreams $d=a_1b_1$, $e=a_2b_2$, $f=a_3b_3$, $g=a_4b_4$ may become $d=a_1b_1$, $e=b_2a_2$, $f=a_3b_3$, $g=b_4a_4$, where bits in alternating bitstreams e and g were shuffled and bits in bitstreams d and f were not.

An exemplary way to receive data in FIG. 2 may be by reading in the input bitstream from one or more sources (box 300). However, other processes may interact with the present invention to supply the data as well.

Figure 3:
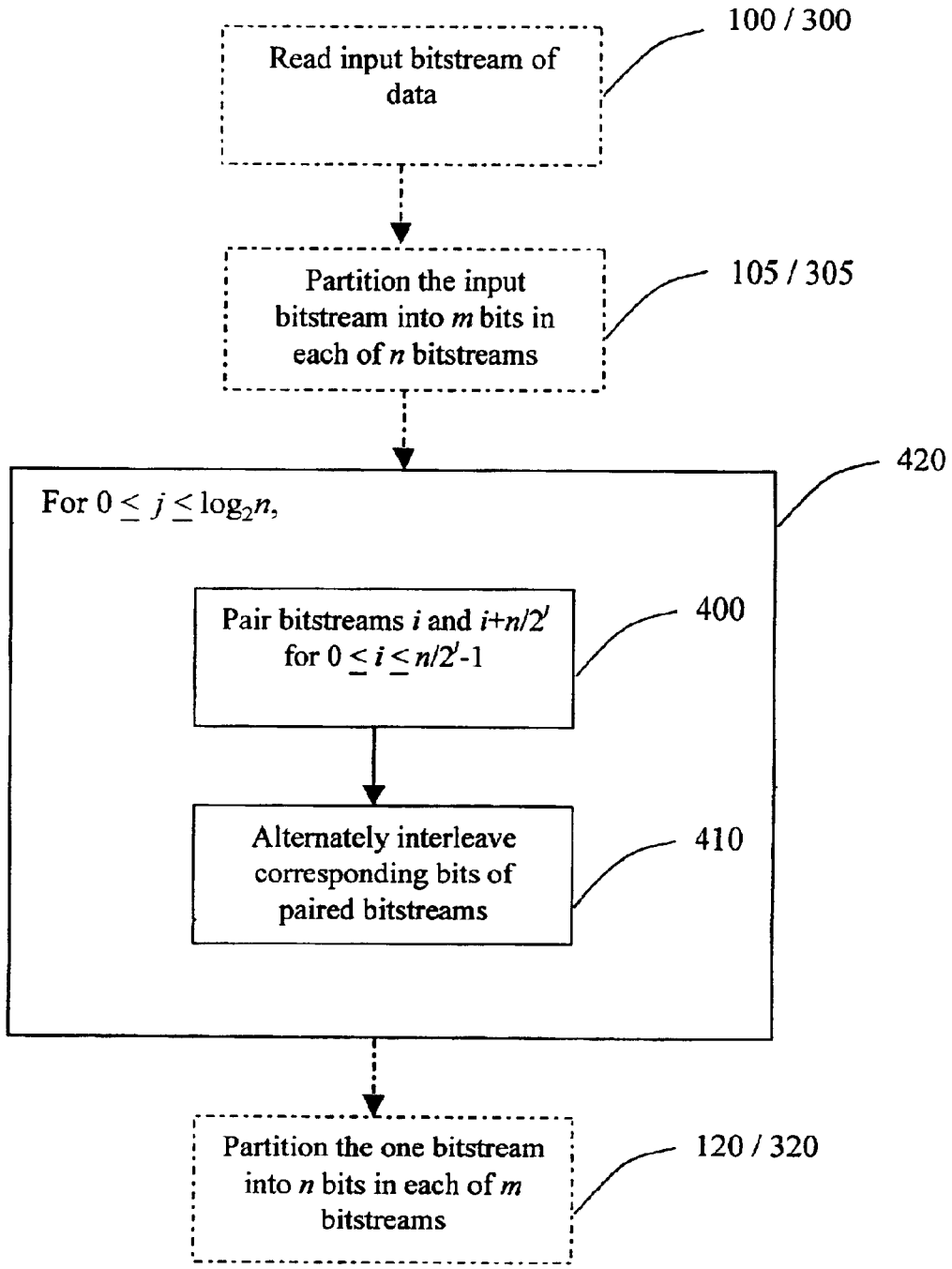
FIG. 3 illustrates an exemplary method for interleaving bits as in the methods of FIGS. 1 and 2.

FIG. 3 illustrates an exemplary method for interleaving bitstreams as in box 110 of FIG. 1 and box 310 of FIG. 2. First, the bitstreams may be paired by twos (box 400). The pairings may be made of bitstreams i and $$i + \frac{n}{2},$$

represented here as $$\left(i, i + \frac{n}{2}\right),$$

where $$0 \leq i \leq \frac{n}{2} - 1$$

and n is the number of bitstreams rounded to a power of 2. The power of 2 may typically be the nearest to the actual number of bitstreams, but may not always be so. For each pairing, the bits may be interleaved with each other, i.e. corresponding bits may be alternately placed in a second bitstream (box 410). The total number of second bitstreams may be $$\frac{n}{2},$$

numbered 0 through $$\frac{n}{2} - 1,$$

corresponding to the i-th bitstreams of which the second bitstreams were created. Next, the second bitstreams may be paired by twos. The pairings may be made as $$\left(i, i + \frac{n}{4}\right),$$

where $$0 \leq i \leq \frac{n}{4} - 1.$$

For each pairing, corresponding bits may be interleaved with each other as described previously to create third bitstreams. The total number of third bitstreams may be $$\frac{n}{4},$$

numbered 0 through $$\frac{n}{4} - 1,$$

corresponding to the i-th second bitstreams of which the third bitstreams were created. The process may be iterated a total of $\log_2 n$ times, where the pairings for the j-th time may be as $$\left(i, i + \frac{n}{2^j}\right),$$

where $$0 \leq i \leq \frac{n}{2^j} - 1$$

and $1 \leq j \leq \log_2 n$ (box 420). The result is one bitstream of interleaved bits. The method of FIG. 3 is more efficient than traditional methods as it uses a minimum number of memory manipulations and instructions to interleave the data.

Figure 4:
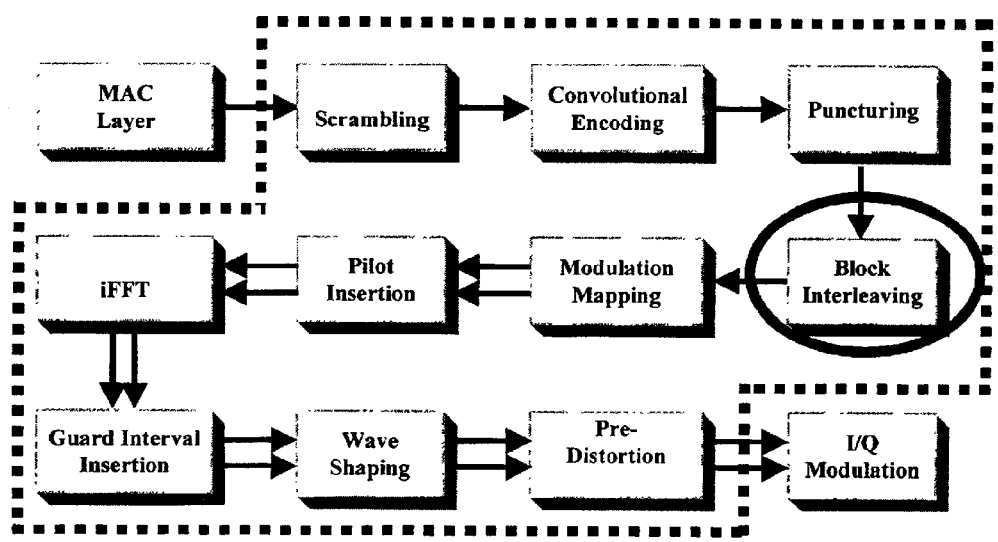
FIG. 4 is a flowchart of the IEEE 802.11a data transmission standard.

The present invention may be applied to the IEEE 802.11a standard at the interleaver stage, located after the encoder/puncture stage and before the modulation mapper stage as shown in FIG. 4. It is to be understood that this application is for exemplary purposes only as other applications that interleave data may also use the present invention. It is to be further understood that any of the methods of FIGS. 1, 2, or 3 may be applied.

The IEEE 802.11a standard defines the interleaver algorithm by a two-part permutation. The first permutation provides for consecutive coded bits being mapped onto non-consecutive subcarriers. The first permutation is defined as:

$$i = \left(\frac{N_{CBPS}}{16}\right)(k \bmod 16) + \text{floor}\left(\frac{k}{16}\right),$$

where k=0, 1, . . . , $N_{CBPS}$-1. The second permutation provides for consecutive coded bits being mapped alternately onto less and more significant bits of the constellation and thereby, long runs of low reliability bits may be avoided. The second permutation is defined as:

$$j = s^* \text{floor}\left(\frac{i}{s}\right) + \left(i + N_{CBPS} - \text{floor}\left(\frac{16 \cdot i}{N_{CBPS}}\right)\right) \bmod s,$$

where i=0, 1, . . . , $N_{CBPS}$-1, k denotes the index to the coded bits before the first permutation, i denotes the index after the first permutation, j denotes the index after the second permutation, $N_{CBPS}$ denotes the number of coded bits per symbol, $N_{BPSC}$ denotes the number of bits per subcarrier, and s=max($N_{BPSC}$/2,1).

Table 1 below shows an exemplary list of the different values of $N_{CBPS}$ and $N_{BPSC}$ as defined in the IEEE 802.11a standard.

TABLE 1

IEEE 802.11a Rate-dependent parameters

| Data Rate (Mbit/s) | Coded bits per subcarrier ($N_{BPSC}$) | Coded bits per OFDM symbol ($N_{CBPS}$) |
|---|---|---|
| 6.9 | 1 | 48 |
| 12.18 | 2 | 96 |
| 24.36 | 4 | 192 |
| 48.54 | 6 | 288 |

The IEEE 802.11a interleaver algorithm specifies that all the coded bits of an OFDM symbol ($N_{CBPS}$) are interleaved and then the interleaved bits are mapped according to the appropriate modulation technique.

The input data to the IEEE 802.11a interleaver algorithm may be from an encoder algorithm. The amount of bitstreams into which the input bitstream is partitioned may depend on the data bitrate as shown in Table 2 below. Table 2 shows that the number of bits per output bitstream equals the number of input bitstreams. As such, the first permutation transposes n bitstreams of 16 bits each into 16 bitstreams of n bits each. The input bitstream is partitioned into the appropriate number of input bitstreams according to Table 2 in order to efficiently implement the IEEE 802.11a interleaver algorithm. The present invention provides such a partitioning of the input bitstream.

The IEEE interleaver algorithm may then prepare the output bitstream that may be stored in output registers for input to the modulation mapper algorithm that modulates the coded, punctured and interleaved bits according to the appropriate modulation technique. The IEEE 802.11a interleaver algorithm may prepare 16 output bitstreams, for example, each including several coded, punctured and interleaved bits. The amount of bits in each output bitstream may depend on the data bitrate as shown in Table 2 below.

TABLE 2

Bitstream data per bitrate

| Date Rate (Mbit/s) | number of input bitstreams | number of bits per output bitstream |
|---|---|---|
| 6.9 | 3 | 3 |
| 12.18 | 6 | 6 |
| 24.36 | 12 | 12 |
| 48.54 | 18 | 18 |

Figure 5:
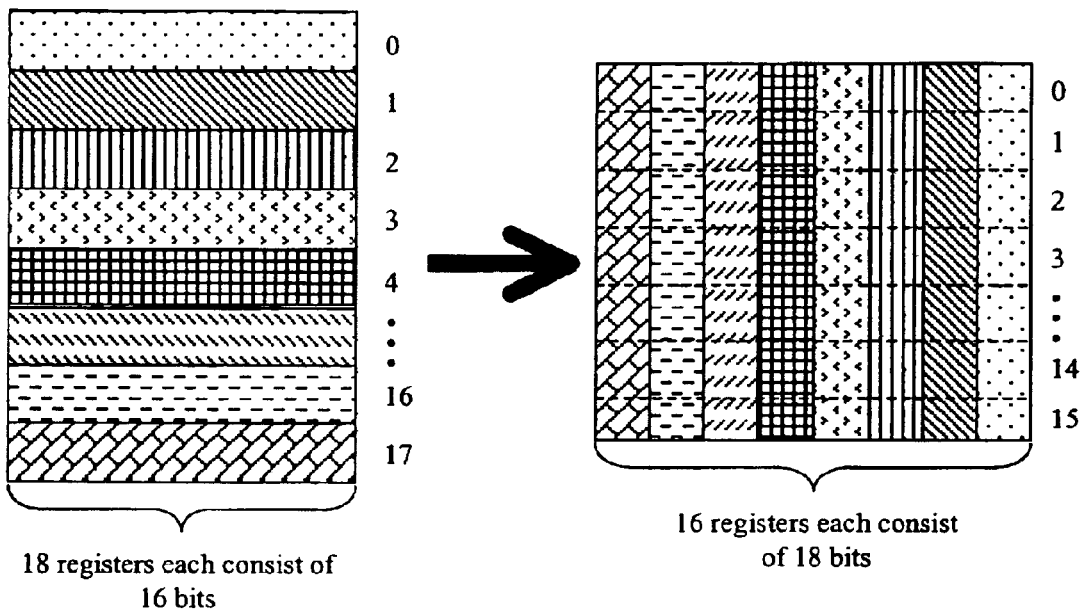
FIG. 5 illustrates exemplary structures of input and output blocks of data at bitrates of 48 and 54 Mbps.

In the following example, the present invention is applied to the IEEE 802.11a interleaver stage to interleave blocks of data with bitrates of 48 and 56 Mbps. FIG. 5 illustrates exemplary structures of an input block of data and a transposed output block created according to boxes 305, 310, and 320 of FIG. 2, as defined by the first permutation of the IEEE 802.11a standard. Overall, the input data in 18 bitstreams (In), each including 16 bits, may be transposed into 16 bitstreams (Out), each including 18 bits, according to Table 2. In the transposition, each of the 16 bits in bitstream i is placed in bit i of each of the 16 output bitstreams, where i=0, . . . , 17, such that (In[0]/bit0→Out[0]/bit0; In[0]/bit1→Out[1]/bit0; In[0]/bit2→Out[2]/bit0, . . . , In[i]/bitj→Out[j]/bit i, . . . ).

Applying the method of FIG. 2, the input bitstream may be partitioned into the 18 bitstreams of 16 bits each (box 305). Then, the input bits may be interleaved (box 310). This interleaving may be done according to the method of FIG. 3. Recall that the method of FIG. 3 uses a power of 2 as the number of bitstreams. For the data bitrate of 48 and 56 Mbps, the number of input bitstreams may be 18. As such, the first 16 bitstreams may be interleaved using the method of FIG. 3 and the remaining 2 may be set aside for later processing.

Figure 6:
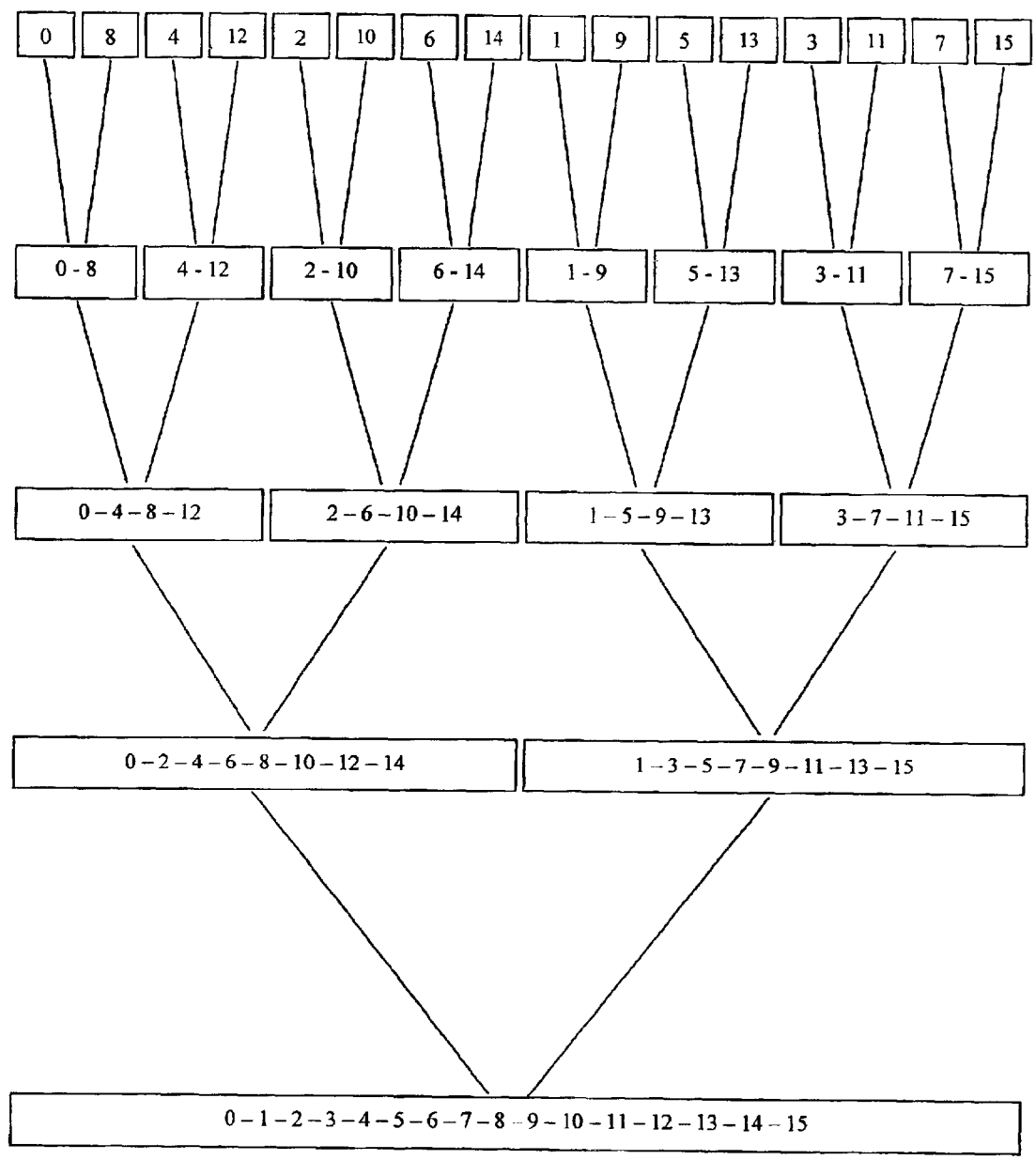
FIG. 6 illustrates an exemplary B-tree structure for interleaving data at bitrates of 48 and 54 Mbps.
Figure 8:
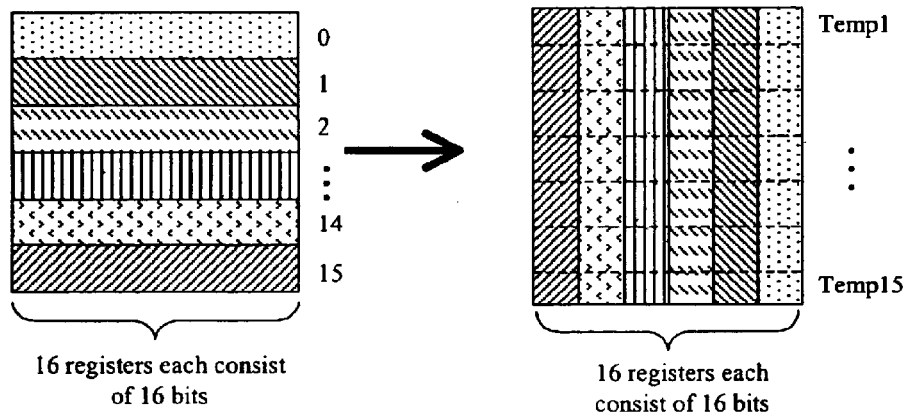
FIG. 8 illustrates an exemplary structure of a partitioned interleaved bitstream at bitrates of 48 and 54 Mbps.

The bit interleaving method of FIG. 3 may be illustrated in a B-tree structure as shown in FIG. 6. Initially, input bitstream pairs (0,8), (1,9), (2,10), (3,11), (4,12), (5,13), (6,14), and (7,15) may be interleaved to produce second bitstreams, designated 0-8, 1-9, 2-10, 3-11, 4-12, 5-13, 6-14, and 7-15. These second bitstreams may be paired according to box 400, FIG. 3, for example. These second bitstream pairs (0-8, 4-12), (1-9, 5-13), (2-10, 6-14), and (3-11, 7-15) may be interleaved to produce third bitstreams, designated 0-4-8-12, 1-5-9-13, 2-6-10-14, and 3-7-11-15. These third bitstreams may also be paired as (0-4-8-12, 2-6-10-14) and (1-5-9-13, 3-7-11-15) and interleaved to produce fourth bitstreams, designated 0-2-4-6-8-10-12-14 and 1-3-5-7-9-11-13-15. These fourth bitstreams may then be interleaved to produce the final interleaved bitstream. Starting with 16 bitstreams of 16 bits each, the final interleaved bitstream may have 256 bits. The bit order may be 16 bits from bit location 0 in bitstreams 0 through 15, followed by 16 bits from bit location 1 in bitstreams 0 through 15, etc.

Figure 7:
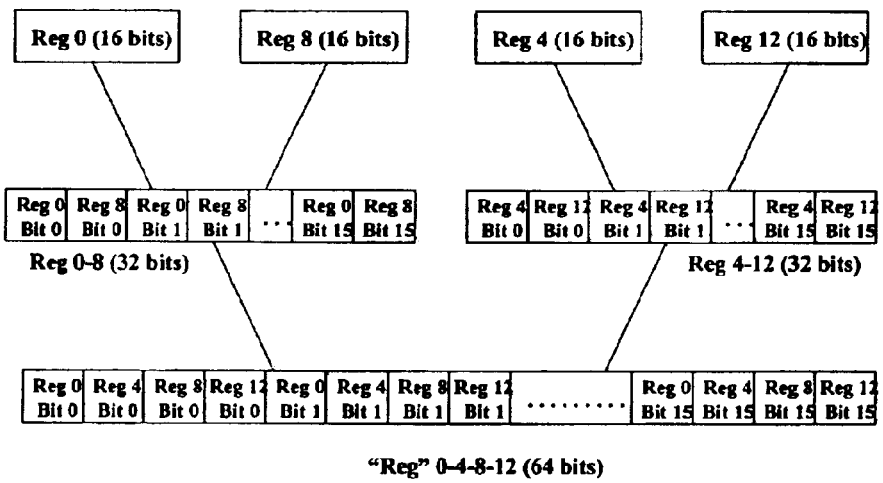
FIG. 7 illustrates exemplary bit ordering after interleaving.

FIG. 7 illustrates an exemplary bit order after interleaving bitstreams 0, 4, 8, and 12. With each iteration, the bits may be ordered consecutively from bits 0 to 15 and bitstreams 0 to 15.

Figure 9:
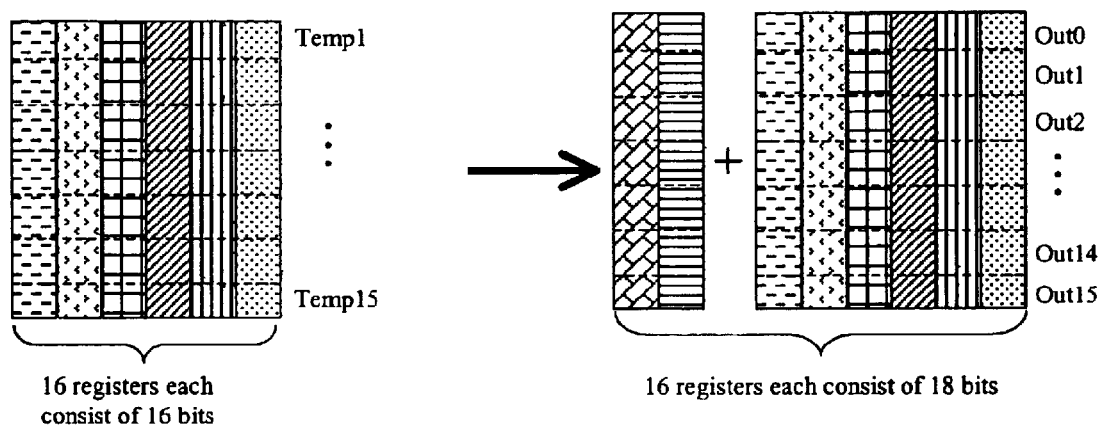
FIG. 9 illustrates an exemplary structure of bitstreams transposed and appended to the structure of FIG. 8.

After the bits are interleaved, the interleaved bitstream may be partitioned into 16 bitstreams of 16 bits (box 320). The remaining two bitstreams which were separated out may be transposed and then appended to the 16 bitstreams, as shown in FIG. 9. The resulting 16 bitstreams may now have 18 bits each as shown in the exemplary output block of FIG. 5.

An inquiry may then be made to decide whether bit shuffling should be performed on the resulting 16 output bitstreams of 18 bits each (box 330). Since the bitrate is high, the bit shuffling may be done in order to separate consecutive bits more thoroughly, thereby reducing corrupt data effects. An exemplary bitrate threshold above which bit shuffling may be performed is 18 Mbps for the IEEE 802.11a interleaver algorithm. The second permutation defines three types of bit shuffling for 48 and 54 Mbps; each operates on a closed group of 3 bits (i.e. bits may shuffle within their group, but do not cross group boundary). The three types of bit shuffling may be ABC→ABC (no change), ABC→CAB (right shift), and ABC→BCA (left shift). Each type of bit shuffling may be applied on 6 consecutive groups of three bits (i.e. 18 consecutive bits). It is to be understood that the bit shuffling types vary based on the data bitrates.

Accordingly, the present invention may apply bit shuffling to the 16 bitstreams in the following manner. First, groups of 3 consecutive bits may be selected in the bitstreams, as defined by the second permutation of the IEEE 802.11a standard (box 340). Then, for alternating bitstreams, more and less significant bits may be shuffled (box 350). For these bitrates, bitstreams 0, 3, 6, 9, 12 and 15 may not be modified since none of their bits may be affected by the second permutation. Bitstreams 1, 4, 7, 10, and 13 may be modified by rotating each group of 3 bits right by 1 (ABC→CAB). Bitstreams 2, 5, 8, 11, and 14 may be modified by rotating each group of 3 bits left by 1 (ABC→BCA).

For example, suppose output bitstreams 0-3 include six bits a b c d e f. Applying the bit shuffling method of the present invention, bitstreams 0 and 3 are not changed. Each group of three bits in bitstream 1 is rotated right by 1, c a b f d e. Similarly, each group of three bits in bitstream 2 is rotated left by 1, b c a e f d. So, looking at the results of the bit shuffling method, the four bitstreams may be:

a b c d e f
c a b f d e
b c a e f d
a b c d e f

The results show that groups of three bits in adjacent bitstreams may have bits shuffled into more or less significant bit positions.

Figure 10:
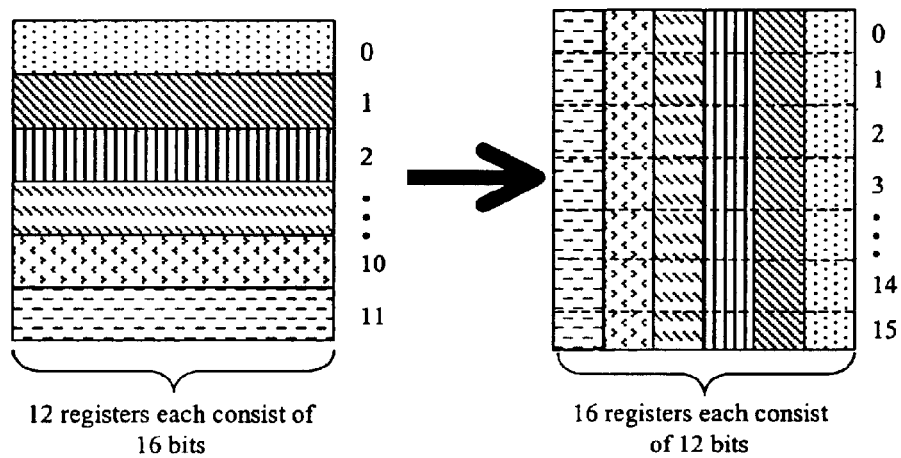
FIG. 10 illustrates exemplary structures of input and output blocks of data at bitrates of 24 and 36 Mbps.

In the next example, the present invention is applied to the IEEE 802.11a interleaver stage to interleave blocks of data with bitrates of 24 and 36 Mbps. FIG. 10 illustrates exemplary structures of an input block of data and a transposed output block created according to boxes 305, 310, and 320 of FIG. 2, for example, as defined by the first permutation of the IEEE 802.11a standard. Overall, the input data in 12 bitstreams (In), each including 16 bits, may be transposed into 16 bitstreams (Out), each including 12 bits, according to Table 2. In the transposition, each of the 16 bits in bitstream i is placed in bit i of each of the 16 output bitstreams, where i=0, . . . , 11, such that (In[0]/bit0→Out[0]/bit0; In[0]/bit1→Out[1]/bit0; In[0]/bit2→Out[2]/bit0, . . . , In[i]/bitj→Out[j]/bit i, . . . ).

Figure 11:
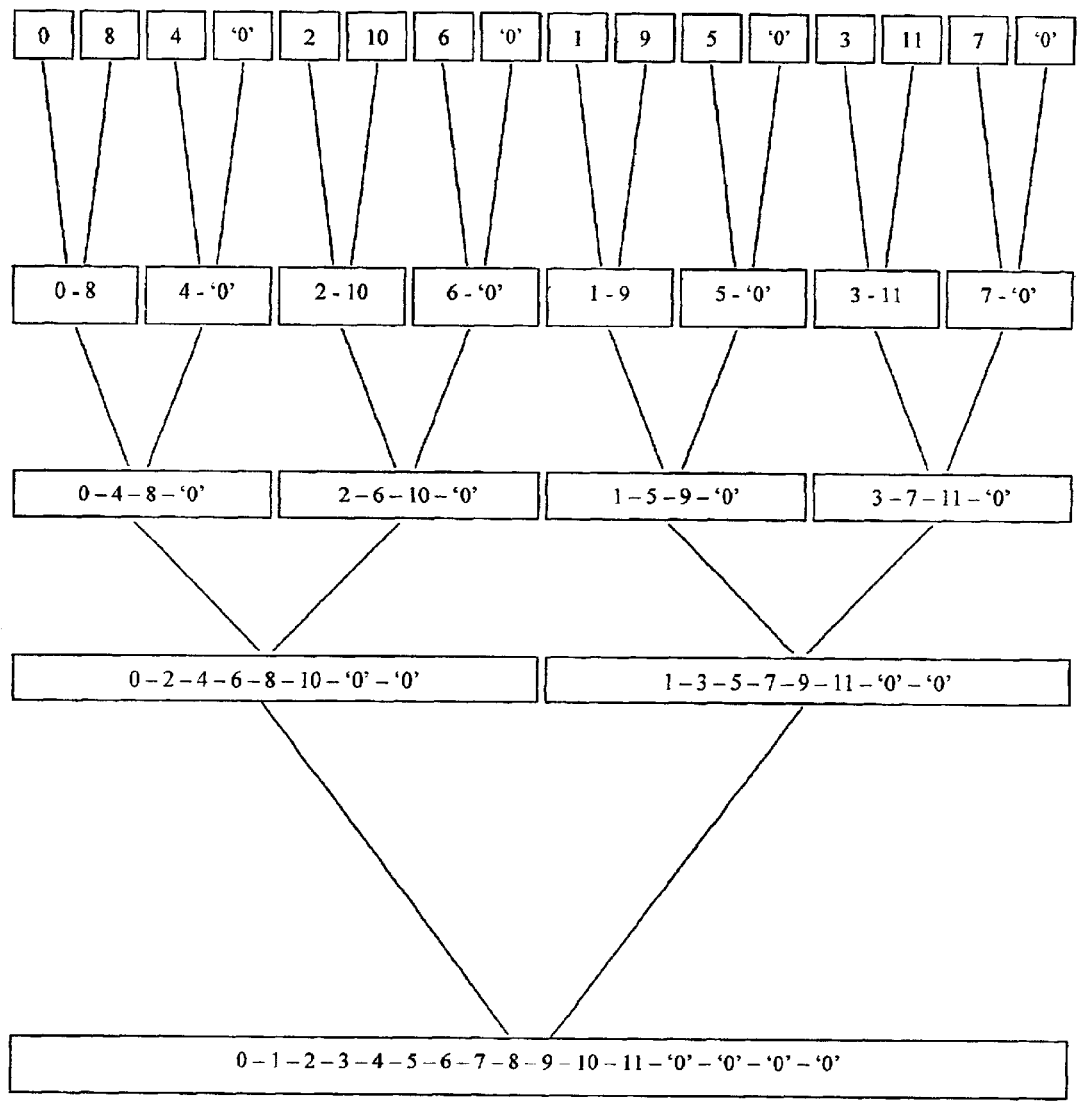
FIG. 11 illustrates an exemplary B-tree structure for interleaving data at bitrates of 24 and 36 Mbps.

Applying the method of FIG. 2, the input bitstream may be partitioned into the 12 bitstreams of 16 bits each (box 305). Then, the input bits may be interleaved (box 310). This interleaving may be done according to the method of FIG. 3. Since the interleaving method of FIG. 3 uses a power of 2 as the number of bitstreams and the number of input bitstreams may be 12 for this data bitrate, 4 additional bitstreams of zeros may be added to fill the number of bitstreams out to 16. The bit interleaving method may be illustrated in a B-tree structure as shown in FIG. 11. Initially, input bitstreams pairs (0,8), (1,9), (2,10), (3,11), (4,'0'), (5,'0'), (6,'0'), and (7,'0') may be interleaved to produce second bitstreams. The process may be repeated until the input bitstreams are interleaved into one bitstream of 256 bits.

After the bits are interleaved, the interleaved bitstream may be partitioned into 16 bitstreams of 16 bits (box 320).

Figure 12:
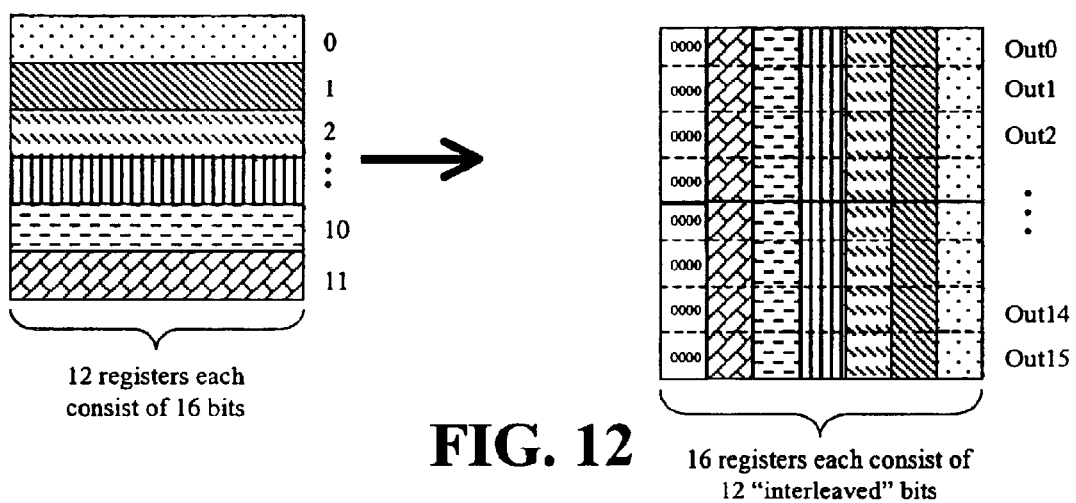
FIG. 12 illustrates an exemplary structure of a partitioned interleaved bitstream at bitrates of 24 and 36 Mbps.

Each interleaved bitstream may be made up of 4 filling zero bits and 12 interleaved data bits, as illustrated in FIG. 12.

An inquiry may then be made to decide whether bit shuffling should be performed on the resulting 16 output bitstreams of 12 bits each (box 330). Since the bitrate exceeds the exemplary threshold of 18 Mbps, the bit shuffling may be done in order to separate more thoroughly consecutive bits, thereby reducing corrupt data effects. The second permutation defines two types of bit shuffling for 24 and 36 Mbps; each operates on a closed group of 2 bits (i.e. bits may shuffle within their group, but do not cross group boundary). The two types of bit shuffling may be AB→AB (no change) and AB→BA (left or right shift). Each type of bit shuffling may be applied on 6 consecutive groups of two bits (i.e. 12 consecutive bits).

Accordingly, the present invention may apply bit shuffling to the 16 bitstreams in the following manner. First, groups of 2 consecutive bits may be selected in the bitstreams, as defined by the second permutation of the IEEE 802.11a standard (box 340). Then, for alternating bitstreams, more and less significant bits may be shuffled (box 350). For these bitrates, bitstreams 0, 2, 4, 6, 8, 10, 12, and 14 may not be modified since none of their bits may be affected by the second permutation. The remaining bitstreams may be modified by rotating each group of 2 bits either right or left by 1 (AB→BA).

For example, suppose output bitstreams 0-3 include four bits a b c d. Applying the bit shuffling method of the present invention, bitstreams 0 and 3 are not changed. Each of the two groups of 2 bits in bitstream 1 is rotated right by 1, b a d c. So, looking at the results of the bit shuffling method, the four bitstreams may be:

a b c d
b a d c
a b c d
b a d c

The results show that the groups of two bits in adjacent bitstreams may have bits shuffled into more or less significant bit positions.

Figure 13:
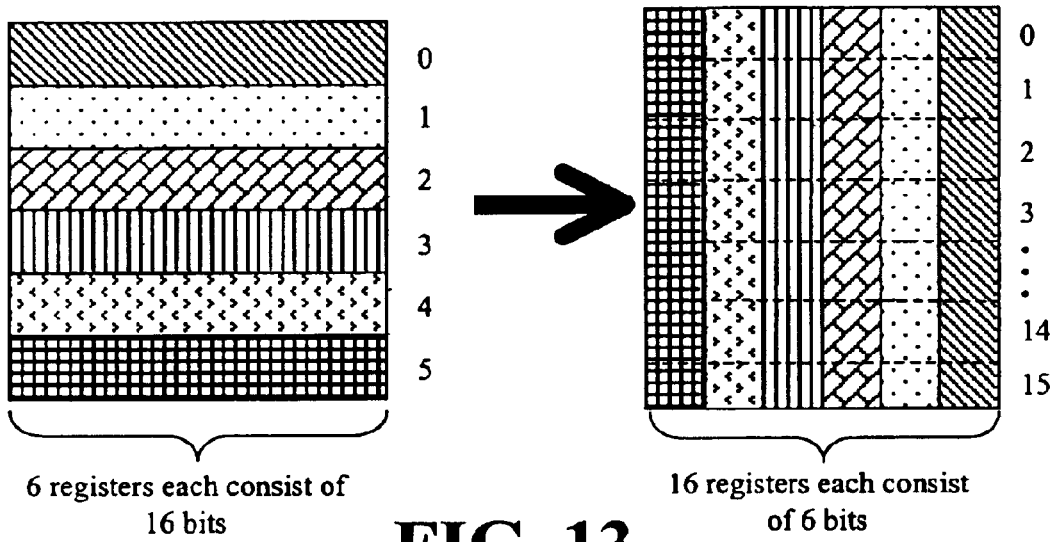
FIG. 13 illustrates exemplary structures of input and output blocks of data at bitrates of 12 and 18 Mbps.

In the following example, the present invention is applied to the IEEE 802.11a interleaver stage to interleave blocks of data with bitrates of 12 and 18 Mbps. FIG. 13 illustrates exemplary structures of an input block of data and a transposed output block created according to boxes 305, 310, and 320 of FIG. 2, for example, as defined by the first permutation of the IEEE 802.11a standard. Overall, the input data in 6 bitstreams (In), each including 16 bits, may be transposed into 16 bitstreams (Out), each including 6 bits, according to Table 2. In the transposition, each of the 16 bits in bitstream i is placed in bit i of each of the 16 output bitstreams, where i=0, . . . , 5, such that (In[0]/bit0→Out[ 0 ]/b i t 0; In[ 0 ]/b i t 1→O u t[ 1 ]/b i t 0; In[0]/bit2→Out[2]/bit0, . . . , In[i]/bitj→Out[j]/bit i, . . . ).

Figure 14:
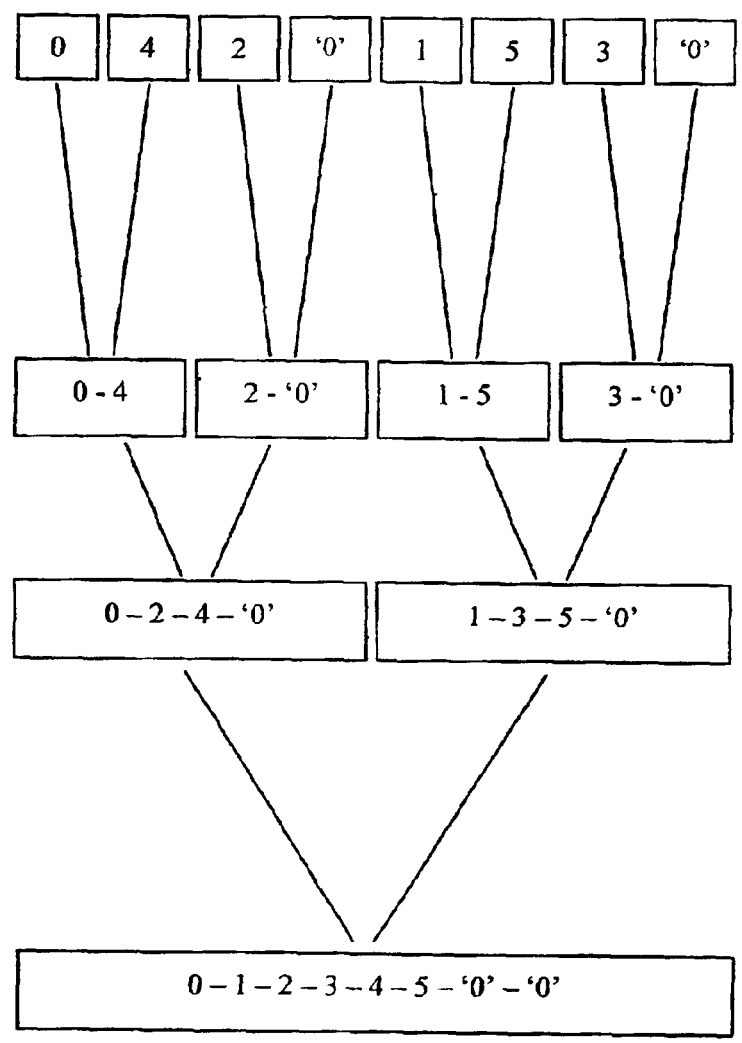
FIG. 14 illustrates an exemplary B-tree structure for interleaving data at bitrates of 12 and 18 Mbps.

Applying the method of FIG. 2, the input bitstream may be partitioned into the 6 bitstreams of 16 bits each (box 305). Then, the input bits may be interleaved (box 310). This interleaving may be done according to the method of FIG. 3. Similar to the bitstreams at 24 and 36 Mbps, additional bitstreams of zeros may be added to fill the number of bitstreams out to 8, a power of 2, such that the method of FIG. 3 may be used. The bit interleaving method may be illustrated in a B-tree structure as shown in FIG. 14. Initially, input bitstreams pairs (0,4), (1,5), (2,'0'), and (3,'0') may be interleaved to produce second bitstreams. The process may be repeated until the input bitstreams are interleaved into one bitstream of 128 bits.

After the bits are interleaved, the interleaved bitstream may be partitioned into 16 bitstreams of 8 bits (box 320).

Figure 15:
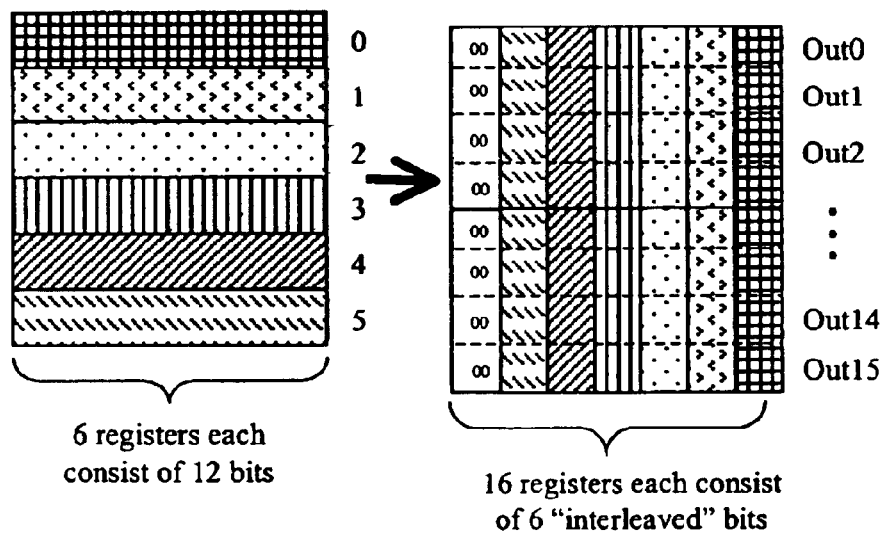
FIG. 15 illustrates an exemplary structure of a partitioned interleaved bitstream at bitrates of 12 and 18 Mbps.

Each interleaved bitstream may be made up of 2 filling zero bits and 6 interleaved data bits, as illustrated in FIG. 15.

An inquiry then may be made to determine if the bit shuffling should be performed (box 330). Since a bitrate of 18 Mbps does not exceed the exemplary threshold, bit shuffling may not be performed. What this means is that the values of i and j in the first and second permutations of the IEEE 802.11a standard are equal. As such, the bit locations are the same and hence no shuffling is done.

Therefore, the second permutation does not modify any one of the bitstreams prepared in the first permutation, and, all the output bitstreams may be written after the first permutation.

Figure 16:
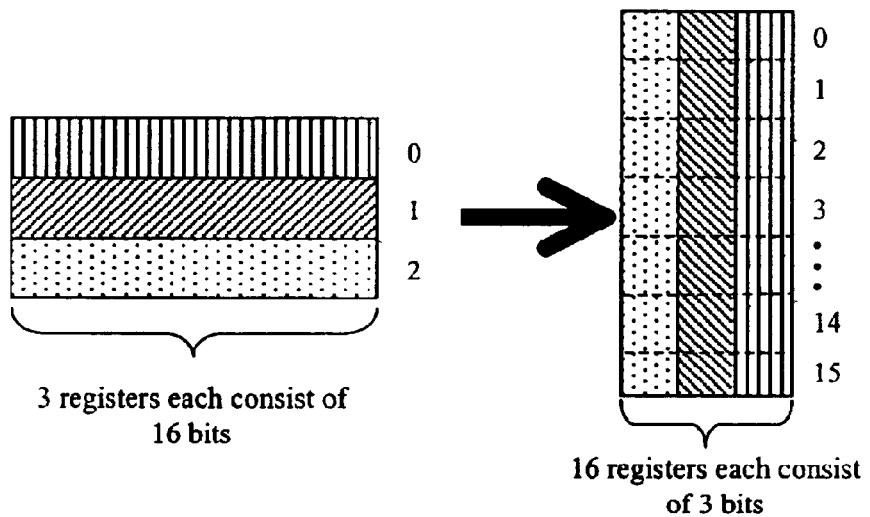
FIG. 16 illustrates exemplary structures of input and output blocks of data at bitrates of 6 and 9 Mbps.

In the next example, the present invention is applied to the IEEE 802.11a interleaver stage to interleave blocks of data with bitrates of 6 and 9 Mbps. FIG. 16 illustrates exemplary structures of an input block of data and a transposed output block created according to boxes 305, 310, and 320 of FIG. 2, for example, as defined by the first permutation of the IEEE 802.11a standard. Overall, the input data in 3 bitstreams (In), each including 16 bits, may be transposed into 16 bitstreams (Out), each including 3 bits, according to Table 2. In the transposition, each of the 16 bits in bitstream i is placed in bit i of each of the 16 output bitstreams, where i=0, . . . , 2, such that (In[0]/bit0→Out[0]/bit0; In[0]/bit1→Out[1]/bit0; In[0]/bit2→Out[2]/bit0, . . . , In[i]/bitj→Out[j]/bit i, . . . ).

Figure 17:
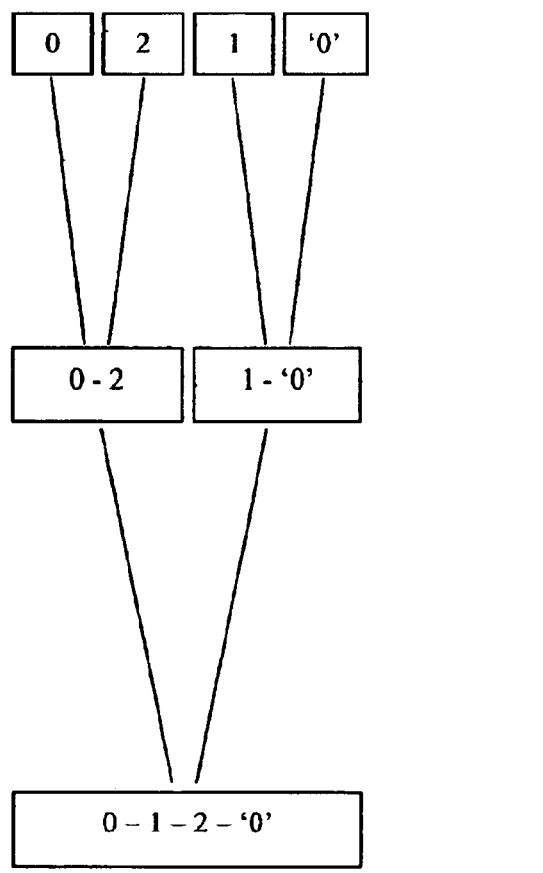
FIG. 17 illustrates an exemplary B-tree structure for interleaving data at bitrates of 6 and 9 Mbps.

Applying the method of FIG. 2, the input bitstream may be partitioned into the 3 bitstreams of 16 bits each (box 305). Then, the input bits may be interleaved (box 310). This interleaving may be done according to the method of FIG. 3. Similar to the bitstreams at 12, 18, 24, and 36 Mbps, additional bitstreams of zeros may be added to fill the number of bitstreams out to 4, a power of 2, such that the method of FIG. 3 may be used. The bit interleaving method may be illustrated in a B-tree structure as shown in FIG. 17. Initially, input bitstreams pairs (0,2) and (1,'0') may be interleaved to produce second bitstreams. The process may be repeated until the input bitstreams are interleaved into one bitstream of 64 bits.

Figure 18:
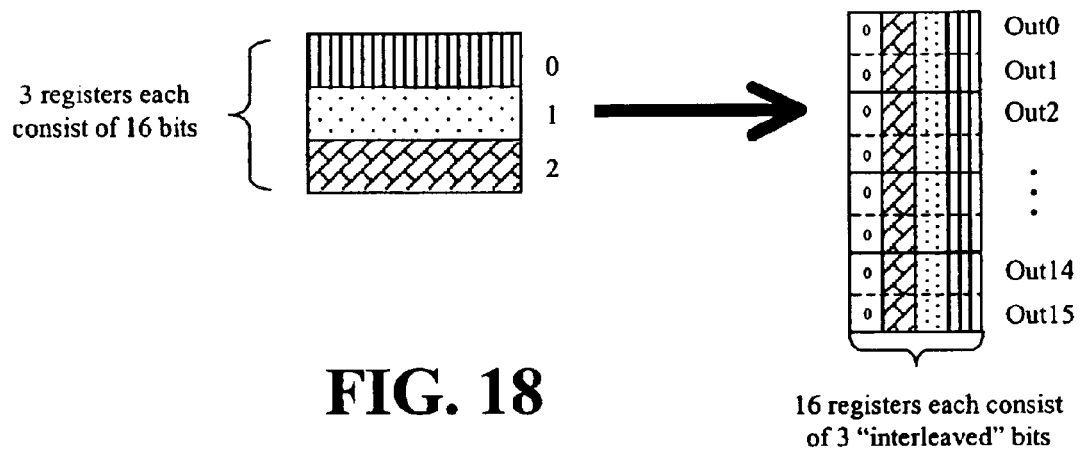
FIG. 18 illustrates an exemplary structure of a partitioned interleaved bitstream at bitrates of 6 and 9 Mbps.

After the bits are interleaved, the interleaved bitstream may be partitioned into 16 bitstreams of 4 bits. Each interleaved bitstream may be made up of 1 filling zero bit and 3 interleaved data bits, as illustrated in FIG. 18.

Since a bitrate of 9 Mbps does not exceed the exemplary threshold, bit shuffling may not be performed. Therefore, the second permutation does not modify any one of the bitstreams prepared in the first permutation, and, all the output bitstreams may be written after the first permutation.

The mechanisms and methods of the present invention may be implemented using a general-purpose microprocessor programmed according to the teachings of the present invention. The present invention thus also includes a machine readable medium which may include instructions which may be used to program a processor to perform a method according to the present invention. This medium may include, but is not limited to, any type of disk including floppy disk, optical disk, and CD-ROMs.

Figure 19:
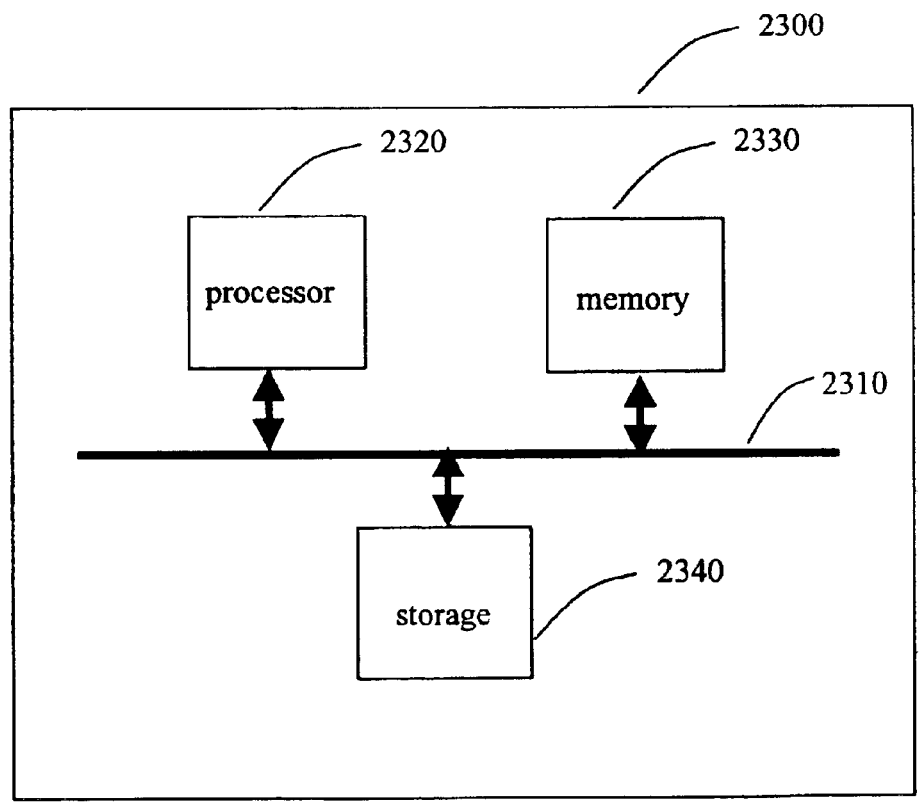
FIG. 19 is a block diagram of one embodiment of a computer system that can implement the present invention.

FIG. 19 is a block diagram of one embodiment of a computer system that can implement the present invention. The system 2300 may include, but is not limited to, a bus 2310 in communication with a processor 2320, a system memory module 2330, and a storage device 2340 according to embodiments of the present invention.

It is to be understood that the structure of the software used to implement the invention may take any desired form, such as a single or multiple programs. It is to be further understood that the method of the present invention may be implemented by software, hardware, or a combination thereof.

Numerous modifications and variations of the present invention are possible in light of the above teachings. It is therefore to be understood that within the scope of the appended claims, the invention may be practiced otherwise than as specifically described herein.

What is claimed is:

1. A method for interleaving blocks of data, comprising:

partitioning an input bitstream into at least two bitstreams;

interleaving the at least two bitstreams to produce a first bitstream, corresponding bits of each of the at least two bitstreams being alternately placed in the first bitstream; and partitioning the first bitstream into at least two different bitstreams, a predetermined number of consecutive bits in the first bitstream being partitioned into each of the at least two different bitstreams.

wherein interleaving the at least two bitstreams comprises:

if the number of the at least two bitstreams is between $2^n$ and $2^{n+1}$, where n is an integer, interleaving $2^n$ of the at least two bitstreams to produce the first bitstream, corresponding bits of each of the $2^n$ bitstreams being alternatively placed in the first bitstream; and setting aside a remaining of the at least two bitstreams.

2. The method of claim 1, wherein partitioning the first bitstream comprises:

transposing the remaining of the at least two bitstreams; and appending the transposed remaining bitstreams onto the at least two different bitstreams.

3. A method for interleaving blocks of data, comprising:

partitioning an input bitstream into at least two bitstreams;

interleaving the at least two bitstreams to produce a first bitstream, correponding bits of each of the at least two bitstreams being alternately placed in the first bitstream; and partitioning the first bitstream into at least two different bitstreams, a predetermined number of consecutive bits in the first bitstream being partitioned into each of the at least two different bitstreams, wherein interleaving the at least two bitstreams comprises:

if the number of the at least two bitstreams is between $2^n$ and $2^{n+1}$, where n is an integer, creating bitstreams containing zeros, so that the number of the at least two bitstreams is $2^{n+1}$; and interleaving the $2^{n+1}$ bitstreams to produce the first bitstream, corresponding bits of each of the $2^{n+1}$ bitstreams being alternately placed in the first bitstream.

4. The method of claim 3, wherein partitioning the first bitstream comprises:

removing bits of zeros, added by the bitstreams containing zeros, from the at least two different bitstreams.

5. A method for interleaving blocks of data, comprising:

partitioning an input bitstream into at least two bitstreams;

interleaving the at least two bitstreams to produce a first bitstream, corresponding bits of each of the at least two bitstreams being alternately placed in the first bitstream; and partitioning the first bitstream into at least two different bitstreams, a predetermined number of consecutive bits in the first bitstream being partitioned into each of the at least two different bitstream, wherein interleaving the at least two bitstreams comprises:

(a) interleaving the i-th and $$\left(i + \frac{n}{2}\right)\text{-th}$$

of the at least two bitstreams to produce corresponding intermediate $2^{nd}$ bitstreams, numbered i, for $$0 \le i \le \frac{n}{2} - 1,$$

where n is the number of at least two bitstreams;

(b) interleaving the i-th and $$\left(i + \frac{n}{2^j}\right)\text{-th}$$

of the intermediate j-th bitstreams to produce corresponding intermediate (j+1)-th bitstreams, numbered i, where $$0 \le i \le \frac{n}{2^j} - 1, 2 \le j \le \log_2 n;$$

and (c) repeating (b) for $j \le \log_2 n$ to produce the first bitstream.

6. The method of claim 5, wherein the predetermined number of consecutive bits of each of the at least two different bitstreams is equal to the number of the at least two bitstreams and wherein the number of bits of each of the at least two bitstreams is equal to the number of the at least two different bitstreams.

7. A method for interleaving blocks of data, comprising:
partitioning an input bitstream into at least two bitstreams;
interleaving the at least two bitstreams to produce a first bitstream, corresponding bits of each of the at least two bitstreams being alternately placed in the first bitstream;
partitioning the first bitstream into at least two different bitstreams, a predetermined number of consecutive bits in the first bitstream being partitioned into each of the at least two different bitstreams; and
if the data exceed a predetermined bitrate, iteratively, shuffling consecutive bits in adjacent different bitstreams into a more or less significant bit position.

8. The method of claim 7, wherein interleaving the at least two bitstreams comprises:
if the number of the at least two bitstreams is between $2^n$ and $2^{n+1}$, where n is an integer, interleaving $2^n$ of the at least two bitstreams to produce the first bitstream, corresponding bits of each of the $2^n$ bitstreams being alternately placed in the first bitstream; and
setting aside a remaining of the at least two bitstreams.

9. The method of claim 8, wherein partitioning the first bitstream comprises:
transposing the remaining of the at least two bitstreams; and
appending the transposed remaining bitstreams onto the at least two different bitstreams.

10. The method of claim 7, wherein interleaving the at least two bitstreams comprises:
if the number of the at least two bitstreams is between $2^n$ and $2^{n+1}$, where n is an integer, creating bitstreams containing zeros, so that the number of the at least two bitstreams is $2^{n+1}$; and
interleaving the $2^{n+1}$ bitstreams to produce the first bitstream, corresponding bits of each of the $2^{n+1}$ bitstreams being alternately placed in the first bitstream.

11. The method of claim 10, wherein partitioning the first bitstream comprises:
removing bits of zeros, added by the bitstreams containing zeros, from the at least two different bitstreams.

12. The method of claim 7, wherein shuffling the consecutive bits comprises:
dividing the adjacent different bitstreams into groups, each group including a predetermined number of consecutive bits; and
rotating the bits within each of the groups a predefined number of positions left or right.

13. A method for interleaving blocks of data, comprising:
partitioning an input bitstream into at least two bitstreams;
interleaving the at least two bitstreams to produce a first bitstream, corresponding bits of each of the at least two bitstreams being alternately placed in the first bitstream;
partitioning the first bitstream into at least two different bitstreams, a predetermined number of consecutive bits in the first bitstream being partitioned into each of the at least two different bitstreams; and
if the data exceed a predetermined bitrate, iteratively, shuffling consecutive bits in adjacent different bitstreams into a more or less significant bit position,
wherein interleaving the at least two bitstreams comprises:

(a) interleaving the i-th and $$\left(i + \frac{n}{2^j}\right)\text{-th}$$

of the at least two bitstreams to produce corresponding intermediate $2^{nd}$ bitstreams, numbered i for $$0 \le i \le \frac{n}{2} - 1,$$

where n is the number of at least two bitstreams;

(b) interleaving the i-th and $$\left(i + \frac{n}{2^j}\right)\text{-th}$$

of the intermediate j-th bitstreams to produce corresponding intermediate (j+1)-th bitstreams, numbered i, for $$0 \le i \le \frac{n}{2^j} - 1, 2 \le j \le \log_2 n;$$

and (c) repeating (b) for $j \le \log_2 n$ to produce the first bitstream.

14. The machine readable medium of claim 13, shuffling the consecutive bits further comprising:
dividing the adjacent different bitstreams into groups, each group including a predetermined number of consecutive bits; and rotating the bits within each of the groups a predefined number of positions left or right.

15. A system for interleaving blocks of data, comprising:
a memory device, having embodied therein the data; and
a processor in communication with the memory device, the processor configured to partition an input bitstream into at least two bitstreams,
interleave the at least two bitstreams of the data to produce a first bitstream, corresponding bits of each of the at least two bitstreams being alternately placed in the first bitstream,
partition the first bitstream into at least two different bitstreams, a predetermined number of consecutive bits in the first bitstream being partitioned into each of the different bitstreams, and
if the data exceed a predetermined bitrate, iteratively, shuffle consecutive bits in adjacent different bitstreams into a more or less significant bit position.

16. The system of claim 15, the processor further configured to:
if the number of the at least two bitstreams of the at least two bitstreams is between $2^n$ and $2^{n+1}$, where n is an integer, interleave $2^n$ of the at least two bitstreams to produce the first bitstream, corresponding bits of each of the $2^n$ bitstreams being alternately placed in the first bitstream; and
set aside a remaining of the at least two bitstreams.

17. The system of claim 15, the processor further configured to:
if the number of the at least two bitstreams of the at least two bitstreams is between $2^n$ and $2^{n+1}$, where n is an integer, create bitstreams containing zeros, so that the number of the at least two bitstreams is $2^{n+1}$; and
interleave the $2^{n+1}$ bitstreams to produce the first bitstream, corresponding bits of each of the $2^{n+1}$ bitstreams being alternately placed in the first bitstream.

18. The system of claim 16, the processor further configured to:
transpose the remaining of the at least two bitstreams; and
append the transposed remaining bitstreams onto the at least two different bitstreams.

19. The system of claim 18, the processor further configured to:
remove bits of zeros, added by the bitstreams containing zeros, from the at least two different bitstreams.

20. The system of claim 15, the processor further configured to:
divide the adjacent different bitstreams into groups, each group including a predetermined number of consecutive bits; and
rotate the bits within each of the groups a predefined number of positions left or right.

21. A system for interleaving blocks of data, comprising:
a memory device, having embodied therein the data; and
a processor in communication with the memory device, the processor configured to
partition an input bitstream into at least two bitstreams,
interleave the at least two bitstreams of the data to produce a first bitstream, corresponding bits of each of the at least two bitstreams being alternately placed in the first bitstream.
partition the first bitstream into at least two different bitstreams, a predetermined number of consecutive bits in the first bitstream being partitioned into each of the different bitstreams, and
if the data exceed a predetermined bitrate, iteratively, shuffle consecutive bits in adjacent different bitstreams into a more or less significant bit position,
the processor further configured to:
(a) interleave the i-th and $$\left(i + \frac{n}{2}\right)\text{-th}$$

of the at least two bitstreams to produce corresponding intermediate $2^{nd}$ bitstreams, numbered i for $$0 \le i \le \frac{n}{2} - 1,$$

where n is the number of at least two bitstreams;
(b) interleave the i-th and $$\left(i + \frac{n}{2^j}\right)\text{-th}$$

of the intermediate j-th bitstreams to produce corresponding intermediate (j+1)-th bitstreams, numbered i, for $$0 \le i \le \frac{n}{2} - 1, 2 \le j \le \log_2 n;$$

and
(c) repeat (b) for $j \le \log_2 n$ to produce the first bitstream.

22. The machine readable medium of claim 21, shuffling the consecutive bits further comprising:
dividing the adjacent different bitstreams into groups, each group including a predetermined number of consecutive bits; and
rotating the bits within each of the groups a predefined number of positions left or right.

23. A machine readable medium containing program instructions for execution on a processor, which when executed by the processor, cause the processor to perform:
partitioning an input bitstream into at least two bitstreams;
interleaving the at least two bitstreams of the data to produce a first bitstream, corresponding bits of each of the at least two bitstreams being alternately placed in the first bitstream;
partitioning the first bitstream into at least two different bitstreams, a predetermined number of consecutive bits in the first bitstream being partitioned into each of the different bitstreams; and
if the data exceed a predetermined bitrate, iteratively, shuffling consecutive bits in adjacent different bitstreams into a more or less significant bit position.

24. The machine readable medium of claim 23, shuffling the consecutive bits further comprising:
dividing the adjacent different bitstreams into groups, each group including a predetermined number of consecutive bits; and
rotating the bits within each of the groups a predefined number of positions left or right.

25. A machine readable medium containing program instructions for execution on a processor, which when executed by the processor, cause the processor to perform:

partitioning an input bitstream into at least two bitstreams;

interleaving the at least two bitstreams of the data to produce a first bitstream, corresponding bits of each of the at least two bitstreams being alternately placed in the first bitstream;

partitioning the first bitstream into at least two different bitstreams, a predetermined number of consecutive bits in the first bitstream being partitioned into each of the different bitstreams; and if the data exceed a predetermined bitrate, iteratively, shuffling consecutive bits in adjacent different bitstreams into a more or less significant bit position, interleaving the at least two bitstreams further comprising:

(a) interleaving the i-th and $$\left(i+\frac{n}{2}\right)\text{-th}$$

of the at least two bitstreams to produce corresponding intermediate $2^{nd}$ bitstreams, numbered i for $$0 \leq i \leq \frac{n}{2^j} - 1,$$

where n is the number of at least two bitstreams;

(b) interleaving the i-th and $$\left(i+\frac{n}{2^j}\right)\text{-th}$$

of the intermediate j-th bitstreams to produce corresponding intermediate (j+1)-th bitstreams, numbered i, for $$0 \leq i \leq \frac{n}{2^j} - 1, 2 \leq j \leq \log_2 n;$$

and (c) repeating (b) for $j \leq \log_2 n$ to produce the first bitstream.

26. The machine readable medium of claim 25, shuffling the consecutive bits further comprising:

dividing the adjacent different bitstreams into groups, each group including a predetermined number of consecutive bits; and rotating the bits within each of the groups a predefined number of positions left or right.

* * * * *

UNITED STATES PATENT AND TRADEMARK OFFICE
CERTIFICATE OF CORRECTION

PATENT NO. : 6,934,901 B2 Page 1 of 1
APPLICATION NO. : 10/000341
DATED : August 23, 2005
INVENTOR(S) : Amit Dagan et al.

It is certified that error appears in the above-identified patent and that said Letters Patent is hereby corrected as shown below:

| Column | Line | |
|---|---|---|
| 13 | 43 | Change "claim 18" to --claim 17--. |

Signed and Sealed this

Nineteenth Day of September, 2006

JON W. DUDAS
*Director of the United States Patent and Trademark Office*